US012613290B2

(12) United States Patent
    Markus

(10) Patent No.: US 12,613,290 B2
(45) Date of Patent: Apr. 28, 2026

(54) CABLE TESTING SYSTEMS AND METHODS FOR TROUBLESHOOTING AND REPAIR INSTRUCTION

(71) Applicant: Brian Daniel Markus, El Dorado Hills, CA (US)

(72) Inventor: Brian Daniel Markus, El Dorado Hills, CA (US)

( * ) Notice: Subject to any disclaimer, the term of this patent is extended or adjusted under 35 U.S.C. 154(b) by 234 days.

(21) Appl. No.: 18/446,095

(22) Filed: Aug. 8, 2023

(65) Prior Publication Data

US 2025/0052835 A1       Feb. 13, 2025

(51) Int. Cl.
    *G01R 31/58* (2020.01)
    *G01R 1/04* (2006.01)

(52) U.S. Cl.
    CPC ............ *G01R 31/58* (2020.01); *G01R 1/0416* (2013.01)

(58) Field of Classification Search
    CPC .............................. G01R 31/58; G01R 1/0416
    See application file for complete search history.

(56) References Cited

U.S. PATENT DOCUMENTS

| | | | |
|---|---|---|---|
| 9,032,460 B1 | 5/2015 | Kondapalli | |
| 9,423,444 B2 * | 8/2016 | Dulger | ................... G01R 31/52 |
| 9,774,142 B1 | 9/2017 | Rust | |
| 2003/0132757 A1 | 7/2003 | Fernandez | |

| | | | |
|---|---|---|---|
| 2004/0204916 A1 | 10/2004 | David | |
| 2007/0014526 A1 * | 1/2007 | Lazo | ....................... G01M 11/33 |
| | | | 385/89 |
| 2014/0344874 A1 * | 11/2014 | Olsen | ................... H04N 17/004 |
| | | | 725/107 |
| 2018/0123937 A1 | 5/2018 | Kent et al. | |
| 2023/0384397 A1 * | 11/2023 | Shaffer | ................ G01R 31/006 |
| 2024/0053395 A1 * | 2/2024 | Roduner | .............. G01R 31/006 |

FOREIGN PATENT DOCUMENTS

| | | | | |
|---|---|---|---|---|
| DE | 102022110193 A1 * | 11/2022 | ............. | G01R 31/58 |

OTHER PUBLICATIONS

ISA/US; International Search Report and Written Opinion for corresponding International Patent Application No. PCT/US24/41268 mailed on Oct. 9, 2024, 9 pages.

* cited by examiner

*Primary Examiner* — Feba Pothen
(74) *Attorney, Agent, or Firm* — NK Patent Law

(57) ABSTRACT

A testing system to provide feedback on the construction of a length of cable includes a testing apparatus having a cable coupler with ports to accept a connector on the end of the length of cable and a tester unit to send a test signal through the ports and length of cable and generate data based on the test signal; a computing device in communication with the testing apparatus to receive the data, process the data to produce a feedback score, associate the score with a discrete instance, store the score; and a display device configured to receive and display information related to the score. The testing system further includes a timer unit to track a time period and provide the time period to the computing device to be stored, used to further rank scores, and displayed by the display device as part of the information related to the score.

16 Claims, 4 Drawing Sheets

Leaderboard – Time - Points

1. Jane Smith – 1 m 38 s – 85 pts
2. Joe Smith – 1 m 45 s – 75 pts
3. Alex Smith – 2 m 7 s – 55 pts

CABLE TESTING SYSTEMS AND METHODS FOR TROUBLESHOOTING AND REPAIR INSTRUCTION

TECHNICAL FIELD

The present disclosure relates to systems and methods for testing electrical cables. More particularly, the present disclosure relates to systems and methods to score and rank cable testing instances which can be used to assist instruction regarding troubleshooting and repair.

BACKGROUND

Cables are a required component for almost all electronic devices and digital equipment to provide a plurality of signal paths for digital signals. As the universe of connected devices continues to grow, the need for sufficient quality cables and their efficient installation also increases. Indeed, estimates from 2020 stated that more than 5 billion kilometers of fiber optic cable (just one of the types of cable utilized to support networks) have been deployed globally. Moreover, there are at least 1.5 million kilometers of underwater fiber optic cable in 2023. Although many of the devices connect to networks through wireless means, these connections still require a plethora of wired networks on the backend.

However, cables, such as Ethernet, coaxial, and fiber optic cables, frequently wear out and are a source of lost time when troubleshooting a system. Indeed, it is often found that the problem with a system is a faulty cable. Moreover, many installations require custom length cables whereby a technician is required to construct the cable and install it. Accordingly, the ability to configure a wired network, construct network cables, and troubleshoot wired network connections are valuable and in demand across all industries.

Central to training and learning these abilities is the testing of cables and wiring in a network. Indeed, whether new or custom constructed, cables and their wiring need to be tested to verify the integrity of the cable and assure the end user of proper operation. Cable test methods exist, but it would be advantageous to have improvements in such test devices, systems, and methods that provide an environment useful for learning and practicing troubleshooting for network systems, help enhance training related to constructing and wiring cables in network systems, and provide feedback through scoring, ranking, and/or timing related to cable construction and/or wiring in scenarios a user might find in various network systems.

SUMMARY

This summary is provided to introduce in a simplified form concepts that are further described in the following detailed descriptions. This summary is not intended to identify key features or essential features of the claimed subject matter, nor is it to be construed as limiting the scope of the claimed subject matter.

In view of the above, one purpose of the present cable testing devices, systems, and methods is to provide an environment useful for learning and practicing troubleshooting for cabled systems, in various aspects. Moreover, the present cable-testing devices, systems, and methods, in certain aspects, particularly relate to cable construction and wiring in a cabled system. Additionally, such cable-testing devices, systems, and methods further provide feedback through scoring, ranking, and/or timing related to cable construction and/or wiring in scenarios a user might find in various cabled systems, in various aspects. It will be understood that the embodiments and principles described herein are described in the context of network cables, such as Ethernet and/or Cat5e/6/7; however, the principles described herein apply equally to other types of cables as well, including, for example, coaxial cables, fiber optic cables, charging cables, audio cables, USB cables, and the like.

According to at least one embodiment, a testing system, to analyze and provide feedback on the construction of a length of cable, includes a first testing apparatus that has a cable coupler and a tester unit connected in electronic communication and a computing device and a display device. In embodiments, the cable coupler comprises a receptacle unit that has a first port and second port, each port configured to accept a connector at an end of the length of cable. In further embodiments, the tester unit comprises at least one signal generator configured to produce and send a test signal through the first port to pass into the length of cable and at least one signal receiver configured to accept the test signal through the second port and generate first data based on the test signal. In embodiments, the computing device is in communication with the first testing apparatus and has a communication module configured to receive the first data from the first testing apparatus. In embodiments, the computing device has a processing unit configured to produce a feedback score based on the first data from instructions stored in one or more memory units of the computing device. The feedback score is associated with a testing instance and the feedback score and the association are stored in one or more memory units of the computing device in embodiments. The display device is configured to receive and display information related to the feedback score, in further embodiments.

In additional embodiments, the first data comprises comparison information on at least one of resistance, impedance, and signal test data with predefined specifications. In certain embodiments, the first testing apparatus includes an output unit configured to communicate information related to the first data. In particular embodiments, wherein the predefined specifications are communicated to the first testing apparatus from the computing device.

In further embodiments, the one or more memory units of the computing device further comprise additional feedback scores stored therein, each of the additional feedback scores associated with a discrete instance (a particular test conducted by a testing apparatus), wherein the computing device produces a ranking from the feedback score and the additional feedback scores and the information related to the feedback score displayed by the display device comprises the ranking. In at least one embodiment, at least a portion of the additional feedback scores is produced from second data generated based on testing of a different length of cable with a second testing apparatus in communication with the computing device.

In various embodiments, the testing system further comprises a timer unit that has an activation control configured to start tracking of a time period. The first testing apparatus is configured to stop tracking of the time period by the timer unit based on the first data and the time unit is configured to transmit a second data based on the time period tracked to the computing device in certain embodiments. In particular embodiments, the computing device also associates the time period tracked with the instance associated with the feedback score and stores the period of time in one or more memory units of the computing device and the information related to the feedback score displayed by the display device comprises the time period. In further embodiments, the one or more memory units of the computing device further comprise additional periods of time stored therein, each of the additional periods of time associated with a discrete instance, wherein the computing device produces a ranking from the time period and the additional periods of time and the information related to the feedback score displayed by the display device comprises the ranking. For example, the information displayed may be in the form of a leaderboard. In a further embodiment, at least a portion of the additional periods of time are associated with second data generated based on testing of a different length of cable with a second testing apparatus in communication with the computing device.

In additional embodiments, the receptacle unit is removably attached to the cable coupler and an alternative receptacle unit that has at least a third port configured to accept a different type of connector than that of the first port and second port is configured to attach to the cable coupler in place of a removed receptacle unit.

In further embodiments, the testing system further comprises an adaptor unit configured to connect to at least one of the first port and second port wherein the adaptor unit comprises a third port configured to accept a different type of connector than that of the first port and second port.

Moreover, the receptacle unit is removably attached to the cable coupler and a patch panel is configured to attach to the cable coupler in place of the removed receptacle unit, in embodiments.

In certain embodiments, the tester unit is removably attached to the cable coupler to allow for removal for repair or replacement with an alternative tester unit.

According to various aspects, a kit, for preparing a cable testing system to analyze and provide feedback on a construction of a first length of cable, includes a first cable coupler that has two receptacle ports, each port configured to receive a connector at an end of the first length of cable; a first cable tester configured to electrically connect to the first cable coupler and send one or more test signals through the first length of cable and configured to generate and transmit test results based on the one or more test signals; and a memory storage device comprising instructions which are configured to cause a computing device to administer a testing scenario wherein the test results are received and stored on the computing device and information regarding the test results is transmitted to a display device in communication with the computing device.

In certain aspects, the kit further includes cable components comprising one or more lengths of wiring and multiple connectors for cable ends, the kit also includes one or more wiring cutting tools, and one or more wiring crimping tools.

In additional aspects, the kit also includes a second cable coupler that has two receptacle ports, each port configured to receive a different connector than the receptacle ports of the first cable coupler.

Moreover, the kit includes, in certain aspects, a second cable coupler and a second cable tester, wherein the second cable coupler has two receptacle ports, each port configured to receive a connector at an end of a second length of cable and wherein the second cable tester is configured to electrically connect to the second cable coupler and send one or more test signals through the second length of cable and configured to transmit test results based on the one or more test signals associated with the second length of cable to the computing device.

Also, the first cable tester of the kit, in various aspects, further includes a timer unit configured to be activated by a user to track a time period from activation until specified test results are generated by the first cable tester and configured to deliver data associated with the time period to the computing device to be associated with the test results, stored on the computing device, and transmitted to the display device.

BRIEF DESCRIPTION OF THE DRAWINGS

The foregoing, as well as the following Detailed Description, is better understood when read in conjunction with the appended drawings. For the purposes of illustration, there are shown in the drawings exemplary embodiments; however, the presently disclosed subject matter is not limited to the specific methods and instrumentalities disclosed.

Figure 1:
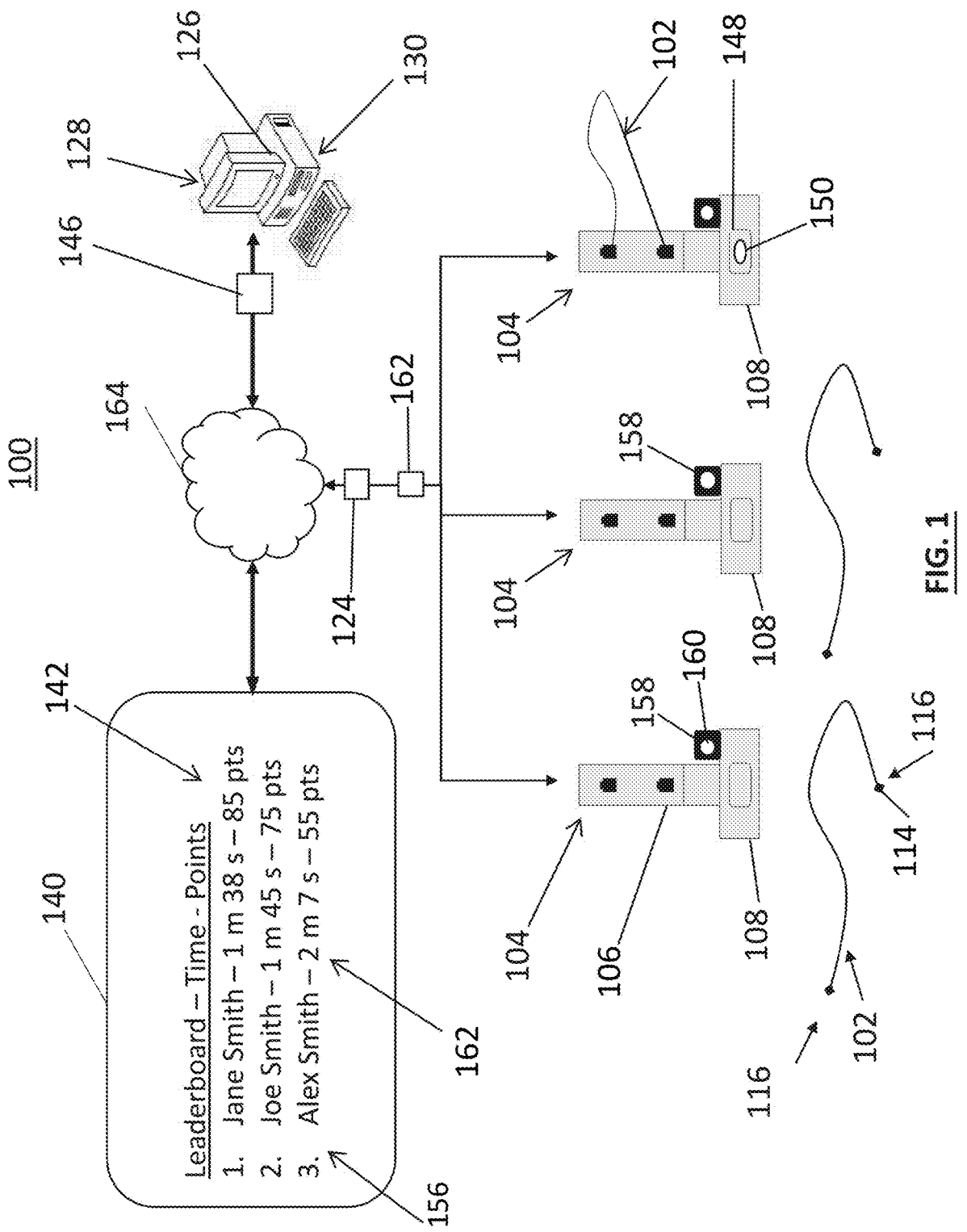
FIG. 1 is a schematic view of a testing system according to one or more embodiments herein including multiple testing apparatuses connected to a computing device which communicates with a display unit.
Figure 2:
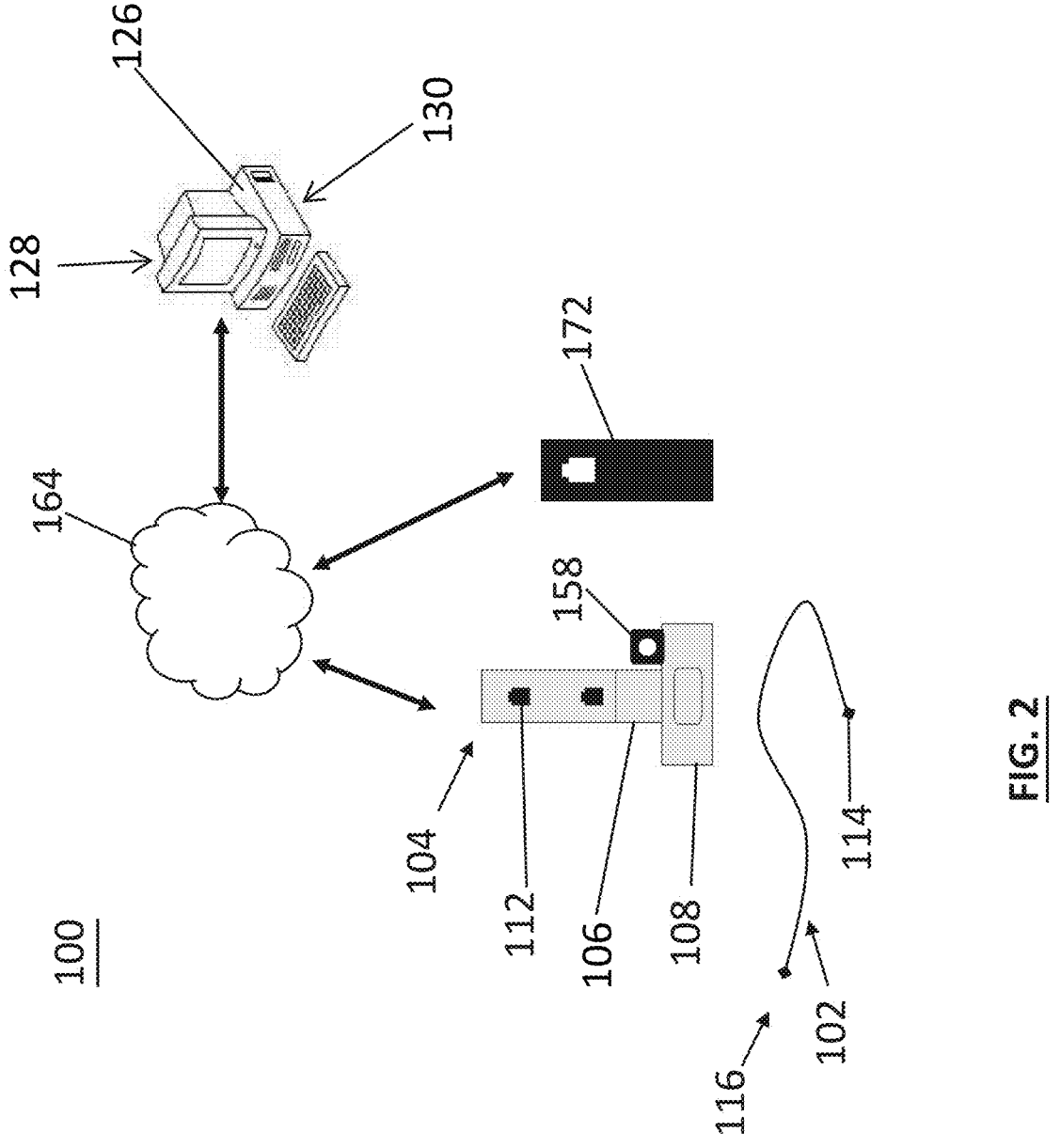
FIG. 2 is a schematic view of a testing system according to one or more embodiments herein including a toning tool.

| ELEMENT NUMBERS | |
| --- | --- |
| 100 | Testing System |
| 102 | Cable Length |
| 104 | Testing Apparatus |
| 106 | Cable Coupler |
| 108 | Tester Unit |
| 110 | Receptacle Unit |
| 112 | Port |
| 114 | Connector |
| 116 | End |
| 118 | Signal Generator |
| 120 | Test Signal |
| 122 | Signal Receiver |
| 124 | Test Data |
| 126 | Computing Device |
| 128 | Communication Module |
| 130 | Processing Unit |
| 132 | Feedback Score |
| 134 | Instructions |
| 136 | Memory Unit |
| 138 | Instance |
| 140 | Display Device |
| 142 | Feeback Score Information |
| 146 | Predefined Specifications |
| 148 | Output Unit |
| 150 | Test Data Information |
| 152 | Additional Feedback Scores |
| 156 | Ranking |
| 158 | Timer Unit |
| 160 | Activation Control |
| 162 | Time Period |
| 164 | Network |
| 168 | Adaptor Unit |
| 170 | Patch Panel |
| 172 | Toning Device |

DETAILED DESCRIPTION

The following description and figures are illustrative and are not to be construed as limiting. Numerous specific details are described to provide a thorough understanding of the disclosure. In certain instances, however, well-known or conventional details are not described in order to avoid obscuring the description. Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. It will be appreciated that same thing can be said in more than one way.

Alternative language and synonyms may be used for any one or more of the terms discussed herein. No special significance is to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to limit the scope of the disclosure, examples of instruments, apparatus, methods, and their related results according to the embodiments of the present disclosure are given below. Note that titles or subtitles may be used in the examples for convenience of a reader, which in no way should limit the scope of the disclosure.

Embodiments of the present disclosure are directed to network training and game scenarios that facilitate hands-on learning and experimentation with real-world connectivity issues. The testing system 100 herein is designed to be modular, in embodiments, with the ability to easily swap in and out portions to accommodate different types of cables and/or devices for troubleshooting.

An embodiment of a testing system 100 to analyze and provide feedback on a construction of a length of cable 102 is shown in FIG. 1. Generally, this testing system 100 includes a testing apparatus 104 which has ports 112 (FIG. 3) to accept the ends 116 of a length of cable 102 and a tester unit 108 to generate test data 124 which is transmitted to a computing device 126 to generate and store a feedback score 132 (FIG. 4) and which transmits feedback score information 142 to a display device 140. In use, a user prepares a length of cable 102, such as by affixing wires of twisted wire pairs at the ends 116 of the cable 102 into appropriate portions of a connector 114 and affixing the connectors 114 to the ends 116, in embodiments. Thereafter, a user affixes each connector 114 into a port 112 so the tester unit 108 passes a test signal 120 (FIG. 3) through cable 102. The tester unit 108 generates test data 124 from one or more test signals 120 which is sent to the computing device 126 to produce a feedback score 132 (FIG. 4) that is stored therein and from which feedback score information 142 thereafter is transmitted to and displayed by a display device 140, in embodiments. Moreover, in embodiments the computing device 126 can administer a testing scenario, such as a time trail, whereby the user must construct a length of cable 102 which produces acceptable test data 124 or complete another task, as quickly as possible. Accordingly, the testing scenarios may be designed with the objective of providing an interactive gamified training environment that provides users education or and practice at rapidly troubleshooting and repairing networks through hands-on training.

In embodiments, the testing system 100 comprises at least one testing apparatus 104 having a cable coupler 106 and a tester unit 108 connected in electronic communication. Indeed, in embodiments, the cable coupler 106 and tester unit 108 may be removably connected, as in FIG. 3, such as by having one or more quick connect electrical connections therebetween. Thereby, a tester unit 108 might be replaced with another tester unit 108. However, in certain embodiments, it is understood that the tester unit 108 is an inseparable part of the testing apparatus 104.

In additional embodiments, the cable coupler 106 has a receptacle unit 110 having ports 112. Each port 112 is configured to accept a connector 114 disposed at an end 116 of a length of cable 102, as in FIG. 1. In embodiments, a receptacle unit 110 may be removably affixed to the cable coupler 106 so that it may be replaced with another receptacle unit 110 as in FIG. 3. Thereby, a user can interchange a receptacle unit 110 with a replacement when broken and/or when a user desires the receptacle unit 110 to have one or more different ports 112. That is, in embodiments, a receptacle unit 110 may have ports 112 which accommodate a specific type of connector 114, such as an RJ45 connector, and a user might wish to replace the receptacle unit 110 with another having one or more ports 112 which accommodate a different type of connector 114, such as a GG45 or ARJ45 connector.

Figure 3:
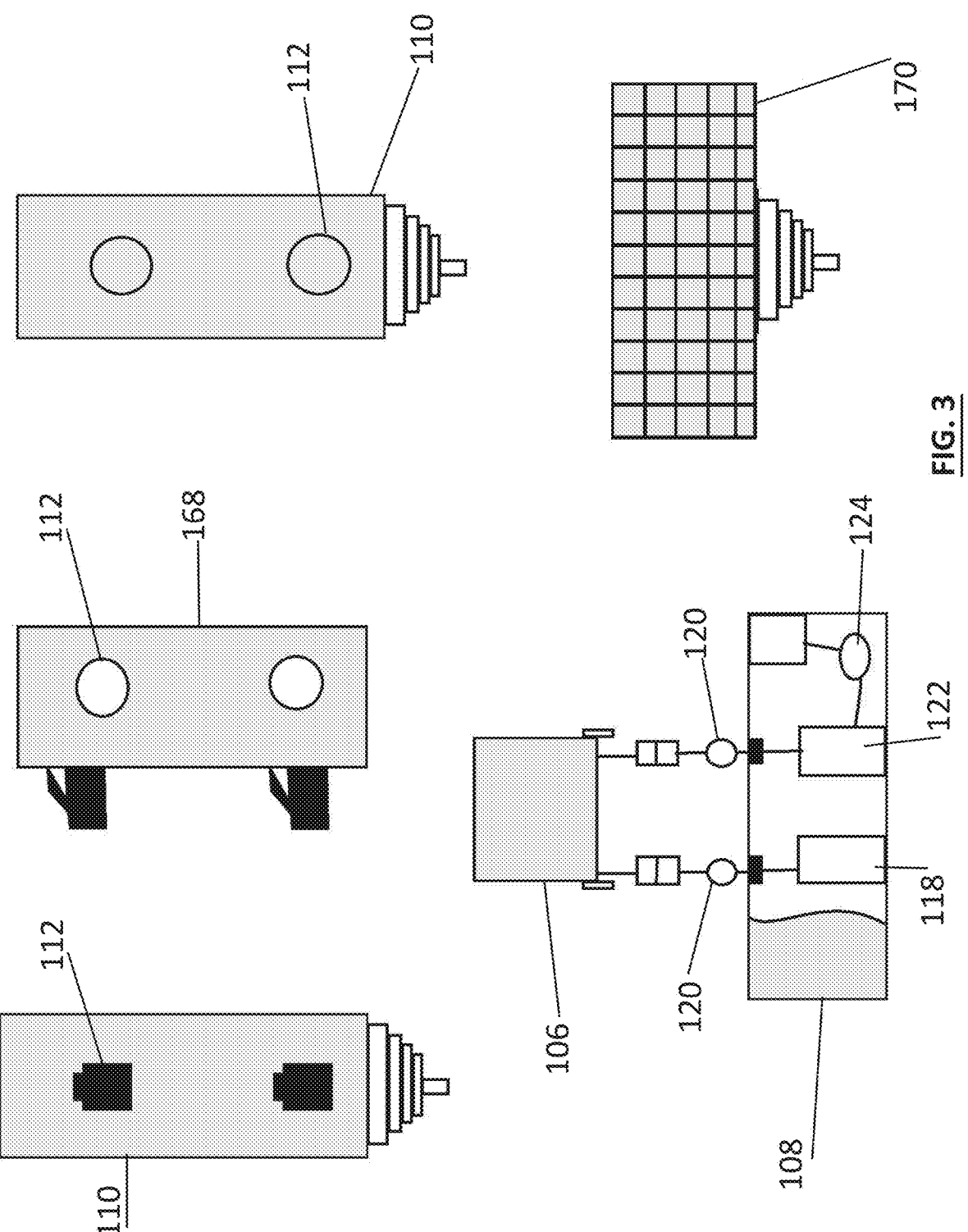
FIG. 3 a side elevation view of an exploded testing apparatus, and an adaptor unit, a replacement receptacle unit, and a patch panel which might optionally utilized therewith according to one or more embodiments herein and showing a tester unit having a portion cutaway.

Further, the tester unit 108 has at least one signal generator 118 and signal receiver 122 in embodiments like that of FIG. 3. The signal generator 118 is configured to produce and send a test signal 120 through one port 112 into a connected length of cable 102 in at least one embodiment. Moreover, the signal receiver 122 is configured, in embodiments, to accept a test signal 120 through another port 112 and generate test data 124 based on the test signal 120. In embodiments, the test data 124 comprises comparison information regarding connectivity of the length of cable 102, correct assembly of connectors 114, resistance, impedance, and signal test data. For example, the signal generator 118 may generate one or more test signals 120 to test each of resistance, impedance, and data integrity and the signal receiver 122 can compare the received test signals 120 with predefined specifications 146 to generate comparison information which forms at least a portion of the test data 124. In embodiments, the testing apparatus 104 includes an output unit 148, such as a speaker, display screen, or the like, to communicate test data information 150 to a user like in FIG. 1. That is, in embodiments, the communication of test data information 150 may be separate from the display of feedback score information 142 on a display device 140. Thereby, a user may receive information about a failure or issue which prevents the test data 124 from being transmitted to the computing device 126. For example, in embodiments, predefined specifications 146 may be transmitted to a testing apparatus 104 by a computing device 126 which only allow test data 124 to be transmitted back to the computing device 126 when comparison information indicates a test signal 120 is within a particular range. However, the predefined specifications 146 may be input directly into a tester unit 108. While the test data 124 may not be transmitted to the computing device 126 in such an example, the output unit 148 can be utilized to communicate the failure to a user, allowing for the user to plan a repair.

Figure 4:
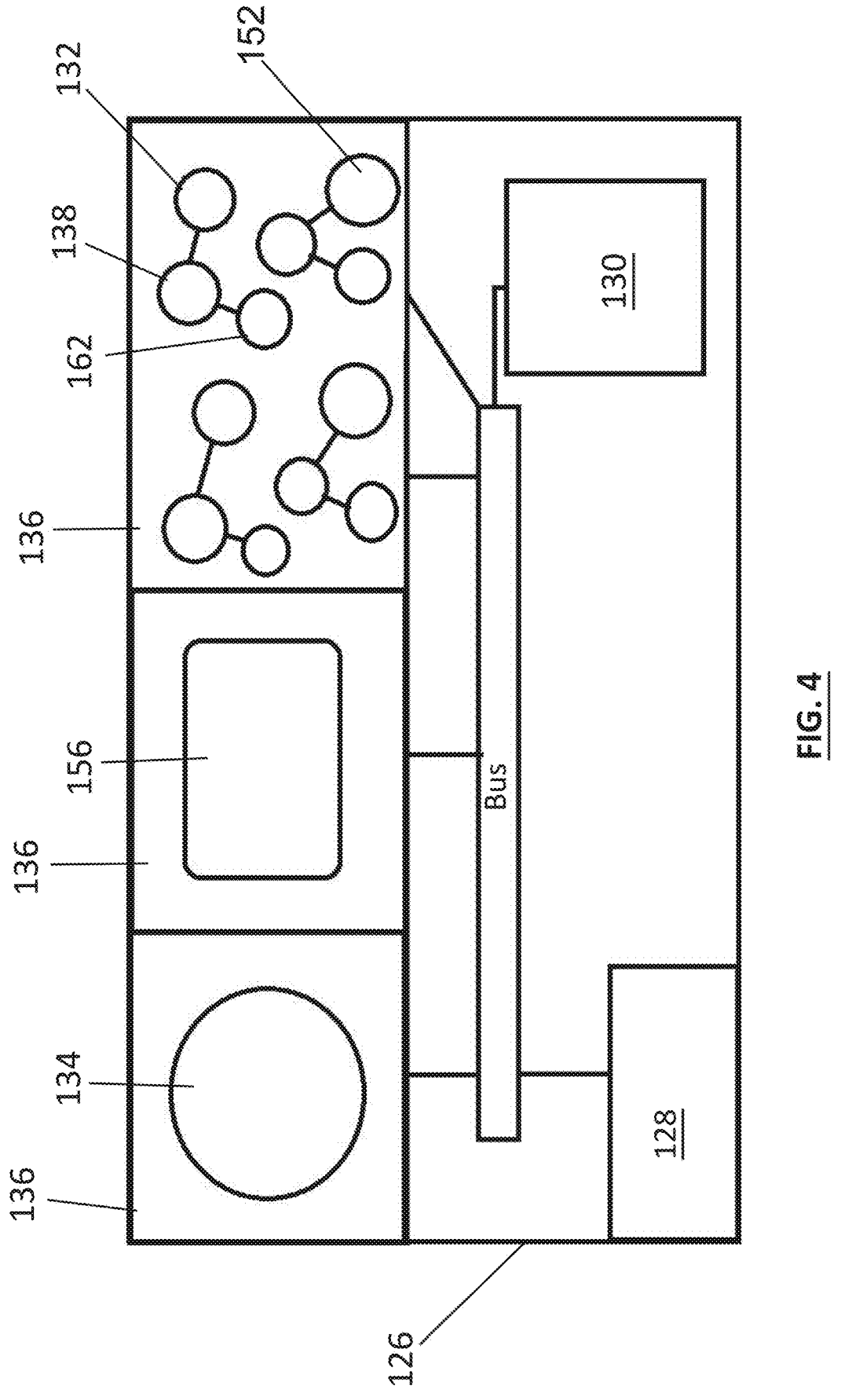
FIG. 4 is a schematic diagram of various portions of a computing device according to one or more embodiments herein.

Moreover, as in FIG. 4, a computing device 126 has a communication module 128 configured to receive test data 124 from a testing apparatus 104 and transmit feedback score information to a display device in embodiments. Similarly, the testing apparatus can also have an analogous communication module, utilized to send test data 124 or other information or utilized to receive predefined specifications 146 of other information in particular embodiments. In embodiments, the computing device 126 also has a processing unit 130 configured to produce a feedback score 132 and one or more memory units 136 storing instructions used by the processing unit 130 to produce the feedback score 132. In further embodiments, the feedback score 132 is associated with a discrete instance 138, such as a unique identifier, and stored in one or more memory units 136. The processing unit 130 may be any commercially available processor. In some embodiments, the processing unit 130 may be an Arduino™ or a Raspberry Pi™ processor.

As in FIG. 4, the one or more memory units 136 may also contain additional feedback scores 152, each associated with their discrete instance 138, which the computing device 126 can utilize to create a ranking 156 in embodiments. Indeed, in at least one embodiment, the feedback score information 142 transmitted to and displayed by the display device 140 includes the ranking 156. In certain embodiments, a portion of the additional feedback scores 152 are produced from test data 124 sent from more than one testing apparatus 104. For example, test data 124 may be generated by two testing apparatuses 104, each utilized by a user who is competing in a testing scenario administered by the computing device 126 and a ranking 156 is produced and utilized to determine a winner. Display device 140 may display the competing users and their times, in a leaderboard fashion. In embodiments, each testing apparatus 104 is in use at the same time and communicates with the computing device 126.

In further embodiments, the testing system 100 also includes a timer unit 158 having an activation control 160 as in FIG. 1. The timer unit 158 is configured to track a time period 162, particularly in response to actuation of the activation control 160 in various embodiments. In certain embodiments, the activation control 160 comprises a button, dial, switch, or some user interface. In further embodiments, the timer unit 158 forms part of the testing apparatus 104 itself. However, the timer unit 158 can also be a separate device which communicates with the testing apparatus 104 and transmits a tracked time period 162 to the testing apparatus 104 and/or the computing device 126, in various embodiments. In at least one embodiment, the testing apparatus 104 is operatively connected to the timer unit 158 and configured to stop tracking a time period 162 based on test data 124. Moreover, the timer unit 158 is configured to transmit a tracked time period 162 to the computing device 126 after tracking has stopped in embodiments. However, in another embodiment the timer unit 158 sends the time period 162 to a portion of the testing apparatus 104, such as the tester unit 108 to be passed on to the computing device 126, such as by being made part of the test data 124 transmitted to the computing device 126.

As in FIG. 4, the one or more memory units 136 of the computing device 126 may also contain additional time periods 162, each associated with a discrete instance 138 that can also have an associated feedback score 132 in embodiments. The computing device 126 can utilize the time periods 162, in addition to or as an alternative to feedback scores 132, 152 to create a ranking 156 in embodiments. Indeed, in at least one embodiment, the feedback score information 142 transmitted to and displayed by the display device 140 includes a ranking based on time periods 162. In certain embodiments, a portion of the additional time periods 162 are sent from more than one testing apparatus 104 or timer units 158. For example, time periods 162 may be generated by two testing apparatuses 104, each utilized by a user who is competing in a testing scenario administered by the computing device 126 to produce an acceptable cable based on predefined specifications 146. Thereby, a ranking 156 may be produced and utilized based on the time periods 162 to determine a winner. In embodiments, each testing apparatus 104 is in use at the same time and communicates with the computing device 126, such as in a race.

In embodiments, the testing system 100 further includes an adaptor unit 168 configured to connect to one or more ports 112 as in FIG. 3. The adaptor unit 168 may comprise one or more ports 112 which accommodate a different type of connector than that of the ports the adaptor unit 168 itself connects to, in embodiments. In further embodiments, the adaptor unit 168 may be a patch panel 170 which can be utilized in certain testing scenarios administered by the computing device 126. For example, the patch panel 170, having multiple ports, may be utilized in a testing scenario wherein a user needs to properly connect each wire of the twisted pairs forming a CAT5e ethernet cable to various patch panel 170 ports to create a "repaired" connection. The testing scenario may also be timed, such as with a timer unit 158, in various embodiments. Moreover, a ranking 156 of one or more of accuracy, within the test data 124, and timing, within the time period 162, may be created by a computing device 126 and displayed on display device 140 in embodiments. In certain embodiments, the receptacle unit 110 itself may be replaced on a cable coupler 106 by a patch panel 170, rather than having the patch panel 170 be an adaptor unit 168.

In certain embodiments, a kit for preparing a cable testing system 100 to analyze and provide feedback on a construction of a length of cable 102 is provided. The kit comprises a cable coupler 106 having two ports 112, each configured to receive a connector 114 at an end 116 of the length of cable 102. The kit further comprises a first cable tester unit 108 configured to electrically connect to the first cable coupler 106 and send one or more test signals 120 through the length of cable 102 and configured to generate and transmit test results based on the one or more test signals 120. The kit also comprises a memory storage device (such as a USB stick, CD-ROM, or the like) having instructions 134 which cause a computing device 126 to administer a testing scenario (such as by sending predefined specifications 146 to a tester unit 108), receive and store test results, and transmit to a display device 140 information about the test results.

In particular embodiments, the kit further comprises cable components, such as lengths of wiring or premade cable and multiple connectors 114 for cable ends 116. The kit may further include a wire cutting tool and/or a wire crimping tool in embodiments. The kit may further include one or more of additional cable couplers 106, tester units 108, and timer units 158, in embodiments.

In further embodiments, the training system 100 or a kit may also include a toning device 172 to assist with certain training scenarios administered by the computing device 126. For example, the computing device 126 may provide a wiring scenario to the testing apparatus 104, or some portion thereof, wherein the user must utilize the toning device 172 to determine what port 112 on the cable coupler 106 should be connected to a port on the toning device 172 to complete the correct connection. The toning device 172 may communicate with the computing device 126, such as by sending relevant test data which identifies whether a correct connection was achieved, how long the user took to achieve a correct connection, and how many failed attempts were made before the correct connection. Moreover, the toning device may be utilized with a separate timer unit 158 in embodiments to provide the timing data to the computing device 126. Similar to other training scenarios mentioned, more than one toning device 172 may be utilized with more than one testing apparatus 104 to provide the ability to compete in a head-to-head challenge and testing data from which may be utilized by the computing device 126 to create a ranking 156, that can be displayed. Thereby, the toning device 172 may be utilized with a training scenario administered by the computing device 126 which trains and tests a user's ability to trace a signal (tone out) and property connect a cable or re-cable a network connection.

In certain embodiments, various portions of the testing system 100 are physically attached and connected through wired connections. For example, the cable coupler 106 and tester unit 108 may form one physically connected testing apparatus 104 and be connected through wired connections. Likewise, in embodiments, the timer unit 158 may be physically attached and wired to one or more portions of the testing apparatus 104, such as a tester unit 108. However, in embodiments, portions of the testing system 100 may be only connected through wired connections. In still further embodiments, various portions of the testing system 100 may be connected through a combination of wired and wireless connections. Similarly, in embodiments, various portions of the testing system 100 may be connected through wired connections may further be removably connected through quick release connectors to allow portions to be exchanged and/or replaced.

In particular embodiments, the testing apparatus 104 may be utilized to perform various functions/tasks without any connection with other portions of the testing system 100. That is, the testing apparatus 104 may be utilized as a standalone training device through which a cable can be connected. For example, the testing apparatus 104 may further comprise an output unit 148 such that test data information 150 may be communicated to a user without any accompanying communication of test data 124 to a computing device 126.

Moreover, in further embodiments, multiple testing apparatuses 104 may be connected together, in a wired or wireless manner, so that certain competitive functionality may be achieved without requiring a computing device 126 to perform a ranking. For example, two tethered testing apparatuses 104 may be utilized to see who achieves acceptable test data 124 first. In embodiments, a report of the outcome may be communicated to one or both users through the output unit 148. In still yet further embodiments, each of the testing apparatuses 104 may further encompass and enclose their own dedicated computing device 126. In such an embodiment, the computing devices 126 may provide a feedback score 132 which can be communicated to a server over the network 164, the server thereof creating the ranking based on communications from various computing devices 126 about their respective test data 124 and feedback scores 132. Moreover, in such an embodiment, the server may further communicate through the network to a display device 140 to coordinate the display of feedback score information 142 and/or a ranking 156.

In various embodiments, the cable coupler 106 may have a receptacle unit 110 designed to test a particular type of cable through its various associated connectors 114. For example, a receptacle unit 110 may be configured to accommodate ethernet cables, coaxial cables, fiber optic cables, or other wires or multiconductor cables. Indeed, various receptacle units 110 may be adapted to be removably attached to the cable coupler 106, and the tester unit 108, to provide versatility in the types of cables that may be tested by a particular testing apparatus 104. Moreover, in embodiments, setting up a testing apparatus 104 to test a particular type of cable or wiring assembly may require a specific receptacle unit 110 and tester unit 108 to be utilized in a testing apparatus 104.

Moreover, in embodiments, testing apparatus 104 may utilize one or more various tester units 108 available for public sale. However, in embodiments, the tester units 108 utilized in the testing apparatuses 104 may be specially built and designed. Moreover, a tester unit 108 of the testing apparatus 104 may utilize and combine a particularly publicly sold external tester device with additional circuitry to achieve functionality of the testing apparatus 104. For example, the additional circuitry may interface with an external tester device to receive test results therefrom and use such to create test data 124 and have hardware circuitry, such as a communication module, to facilitate transmission of the test data 124 to a computing device 126. Indeed, the additional circuitry may be operatively connected to the output unit 148 and produce communication with a user, in embodiments.

In an embodiment of use, the computing device 126 may contain instructions 134 (as in FIG. 4), in the form of a program or the like, for orchestrating a training scenario where each of multiple testing apparatuses 104 are set up in a time and/or accuracy trial where users compete against each other. For example, one training scenario may include initializing a time trial, such as through a timer unit 158, to assemble and test a particular type of cable 102. Thereby, when the user is ready, they may activate the activation control 160 of the timer unit 158 starting their time trial. Further, once they have assembled the cable 102 they connect the ends 116 to the ports 112 of the testing apparatus 104. Moreover, once connected, a tester unit 108 completes one or more tests utilizing one or more test signals 120 to produce test data 120 which confirms the functionality of the cable 102. If the cable 102 is determined to be functional, the timer unit 158 for that user stops tracking the time period 162 and the test data 124 and time period 162 are sent to and stored by the computing device 126. Additionally, as multiple users complete the time trial training scenario, the computing device 126 generates a ranking 156 and transmits such to a display device 140. However, if the cable 102 is not determined to be functional based on the test data 124, the timer unit 158 may continue to run and the user may be alerted through the output unit 148 that the cable failed the test. In certain embodiments, the output unit 148 might include specific information about the failure. Thereafter, the user may rework the cable 102 and test it again.

Additionally, in particular embodiments, the display device 140 may be configured to display a time period 162 from start to finish in completing a training scenario. In various embodiments, the display device 140 may be configured to show time periods 162 and or feedback score information 142 of top users. Moreover, a display device may show various rankings 156 alone or at the same time, such as the top 10 users ranked by their time period, the top 4 users ranked overall, and the last five users that competed.

In various embodiments, data is sent between various portions of the testing system 100, such as test data 124 being sent to the computing device 126 from the testing apparatus 104 and predefined specifications 146 being sent from the computing device 126 to the testing apparatus 104. In embodiments, the transmission and receipt of data between various portions of the testing system 100 are conducted through a network 164. Network 164 may include any combination of wired or wireless networks, such as a Wi-Fi router connected to the internet or a cellular tower connected to the internet. Network 164 may further include either local servers or cloud servers. Various portions of the testing system 100 may be connected through USB cables or ethernet cables.

Moreover, in embodiments, the computing device 126 may comprise a backend server to which various client devices, such as the testing apparatus 104, the display device 140, or other computing devices, may connect to receive data and/or pass instructions. For example, a ranking 156 may be transmitted to the display device 140 by being stored on a server, which forms part of the network 164, from which the display device 140 may request the ranking 156.

In general, the network 164 through which various portions of the system may communicate, may be a cellular network, a broadband network, a telephonic network, an open network, such as the Internet, or a private network, such as an intranet and/or the extranet, or any combination thereof. For example, the Internet can provide file transfer, remote log in, email, news, RSS, cloud-based services, instant messaging, visual voicemail, push mail, VOIP, and other services through any known or convenient protocol, such as, but is not limited to the TCP/IP protocol, UDP, HTTP, DNS, FTP, UPnP. NSF, ISDN, PDH, RS-232, SDH, SONET, etc. Indeed, communications can be achieved via, but are not limited to, one or more of WiMax, a Local Area Network (LAN), Wireless Local Area Network (WLAN), a Personal area network (PAN), a Campus area network (CAN), a Metropolitan area network (MAN), a Wide area network (WAN), a Wireless wide area network (WWAN), or any broadband network, and further enabled with technologies such as, by way of example, Global System for Mobile Communications (GSM), Personal Communications Service (PCS), Bluetooth, WiFi, Fixed Wireless Data, 2G, 2.5G, 3G (e.g., WCDMA/UMTS based 3G networks), 4G, IMT-Advanced, pre-4G. LTE Advanced, mobile WiMax, WiMax 2, WirelessMAN-Advanced networks, enhanced data rates for GSM evolution (EDGE), General packet radio service (GPRS), enhanced GPRS, iBurst, UMTS, HSPDA, HSUPA, HSPA, HSPA+, UMTS-TDD, 1×RTT, EV-DO, messaging protocols such as, TCP/IP, SMS, MMS, extensible messaging and presence protocol (XMPP), real time messaging protocol (RTMP), instant messaging and presence protocol (IMPP), instant messaging, USSD, IRC, or any other wireless data networks, broadband networks, or messaging protocols.

The network 164 can be any collection of distinct networks operating wholly or partially in conjunction to provide connectivity to the client devices and/or various portions of the testing system 100 and may appear as one or more networks to the various portions and/or devices. In one embodiment, communications to and from the various portions and/or devices can be achieved by, an open network, such as the Internet, or a private network, broadband network, such as an intranet and/or the extranet. In one embodiment, communications can be achieved by a secure communications protocol, such as secure sockets layer (SSL), or transport layer security (TLS).

As will be appreciated by one skilled in the art, aspects of the technology described herein may be embodied as a system, method, or computer program product. Accordingly, aspects of the technology may take the form of an entirely hardware embodiment, an entirely software embodiment (including firmware, resident software, micro-code, etc.) or an embodiment combining software and hardware aspects that may all generally be referred to herein as a "circuit," "module," "unit," or "system." Furthermore, aspects of the technology may take the form of a computer program product embodied in one or more computer readable medium(s) having computer readable program code embodied thereon. Herein, references to a program or code may also encompass and be referred to as "instructions" such as in instructions 134 of the present embodiments of the testing system 100.

Any combination of one or more computer readable medium(s), e.g., memory units 136 and/or a memory storage device identified in embodiments of the present system, may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code, e.g., instructions 134, embodied on a computer readable medium may be transmitted using any appropriate medium, including but not limited to wireless, wireline, optical fiber cable, RF, etc., or any suitable combination of the foregoing.

Instructions 134 and other computer program code for carrying out operations for aspects of the technology described herein may be written in any combination of one or more programming languages, including object oriented and/or procedural programming languages. Programming languages may include, but are not limited to: Ruby®, JavaScript®, Java®, Python®, PHP, C, C++, C#, Objective-C®, Go®, Scala®, Swift®, Kotlin®, OCaml®, or the like. The program code and instructions 134 may execute entirely on the user's computer, partly on the user's computer, as a stand-alone software package, partly on the user's computer, and partly on a remote computer or entirely on the remote computer or server. In the latter scenario, the remote computer may be connected to the user's computer through any type of network 164, described previously.

These computer program instructions 134 may be provided to a processing unit 130 of a general-purpose computer, special purpose computer, or other programmable data processing apparatus to produce a machine, such that the instructions 134, which execute via the processing unit 130 of the computer or other programmable data processing apparatus, create means for implementing the functions/acts specified in the descriptions of the testing system 100 herein.

These computer program instructions 134 may also be stored in a computer readable medium that can direct a computer, other programmable data processing apparatus, or other devices to function in a particular manner, such that the instructions 134 stored in the computer readable medium produce an article of manufacture including instructions 134 which implement the function/act specified in the descriptions of the testing system 100 herein.

The computer program instructions 134 may also be loaded onto a computing device 126, other programmable data processing apparatus, or other devices to cause a series of operational steps to be performed on the computing device 126, other programmable apparatus or other devices to produce a computer implemented process such that the instructions which execute on the computing device 126 or other programmable apparatus provide processes for implementing the functions/acts specified in the descriptions of the testing system 100 herein.

Any dimensions expressed or implied in the drawings and these descriptions are provided for exemplary purposes. Thus, not all embodiments within the scope of the drawings and these descriptions are made according to such exemplary dimensions. The drawings are not necessarily made to scale. Thus, not all embodiments within the scope of the drawings and these descriptions are made according to the apparent scale of the drawings with regard to relative dimensions in the drawings. However, for each drawing, at least one embodiment is made according to the apparent relative scale of the drawing.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that when an element or layer is referred to as being "on" another element or layer, the element or layer can be directly on another element or layer, or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below," "beneath," "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments of the inventive subject matter are described herein with reference to plan and perspective illustrations that are schematic illustrations of idealized embodiments of the inventive subject matter. As such, variations from the shapes of the illustrations as a result, for example, of manufacturing techniques and/or tolerances, are to be expected. Thus, the inventive subject matter should not be construed as limited to the particular shapes of objects illustrated herein, but should include deviations in shapes that result, for example, from manufacturing. Thus, the objects illustrated in the figures are schematic in nature and their shapes are not intended to illustrate the actual shape of a region of a device and are not intended to limit the scope of the inventive subject matter.

The terminology used herein is for the purpose of describing particular embodiments only and is not intended to be limiting of the present inventive subject matter. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced items. Although any methods, devices, and materials similar or equivalent to those described herein can be used in the practice or testing of the presently disclosed subject matter, representative methods, devices, and materials are now described.

In the drawings and specification, there have been disclosed typical preferred embodiments of the inventive subject matter and, although specific terms are employed, they are used in a generic and descriptive sense only and not for purposes of limitation, the scope of the inventive subject matter being set forth in the following claims.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A testing system to analyze and provide feedback on a construction of a length of cable, the testing system comprising:

a first testing apparatus comprising a cable coupler and a tester unit connected in electronic communication, wherein the cable coupler comprises a receptacle unit having a first port and second port, each port configured to accept a connector at an end of the length of cable, wherein the tester unit comprises at least one signal generator configured to produce and send a test signal through the first port to pass into the length of cable, wherein the tester unit further comprises at least one signal receiver configured to accept the test signal through the second port and generate first data based on the test signal, and wherein the tester unit is removably attached to the cable coupler to allow for removal for repair or replacement with an alternative tester unit;

a timer unit having an activation control configured to start tracking of a time period, wherein the timer unit is configured to be activated by a user to track a time period from activation until specified test results are generated by the tester unit;

a computing device in communication with the first testing apparatus and the timer unit, the computing device having a communication module configured to receive the first data from the first testing apparatus and receive data associated with the time period from the timer unit, a processing unit configured to produce a feedback score based on the first data from instructions stored in one or more memory units of the computing device, wherein the feedback score is associated with an instance and the data associated with the time period, wherein the feedback score and association are stored in one or more memory units of the computing device; wherein the one or more memory units of the computing device further comprise additional periods of times stored therein, each of the additional periods of times associated with a discrete instance, wherein the computing device produces a ranking from the time period and additional feedback scores; and a display device configured to receive and display information related to the feedback score, wherein the information related to the feedback score displayed by the display device comprises the ranking and data associated with the time period.

2. The testing system of claim 1, wherein the first data comprises comparison information of resistance, impedance, and signal test data with predefined specifications.

3. The testing system of claim 2, wherein the first testing apparatus includes an output unit configured to communicate information related to the first data.

4. The testing system of claim 2, wherein the predefined specifications are communicated to the first testing apparatus from the computing device.

5. The testing system of claim 1, wherein at least a portion of the additional feedback scores is produced from second data generated based on testing of a different length of cable with a second testing apparatus in communication with the computing device.

6. The testing system of claim 1, wherein the first testing apparatus is configured to stop tracking of the time period by the timer unit based on the first data and the timer unit is configured to transmit a second data based on the time period tracked to the computing device.

7. The testing system of claim 1, wherein at least a portion of the additional periods of time are associated with second data generated based on testing of a different length of cable with a second testing apparatus in communication with the computing device.

8. The testing system of claim 1 further comprising an alternative receptacle unit having at least a third port configured to accept a different type of connector than that of the first port and second port, wherein the alternative receptable unit is configured to attach to the cable coupler in place of a removed receptacle unit.

9. The testing system of claim 1, the testing system further comprising an adaptor unit configured to connect to at least one of the first port and second port wherein the adaptor unit comprises a third port configured to accept a different type of connector than that of the first port and second port.

10. The testing system of claim 1 further comprising a patch panel configured to attach to the cable coupler in place of a removed receptacle unit.

11. A kit for preparing a cable testing system to analyze and provide feedback on a construction of a first length of cable, the kit comprising:

a first cable coupler having two receptacle ports, each port configured to receive a connector at an end of the first length of cable;

a first cable tester configured to electrically connect to the first cable coupler and send one or more test signals through the first length of cable and configured to generate and transmit test results based on the one or more test signals, wherein the first cable tester further comprises a timer unit configured to be activated by a user to track a time period from activation until specified test results are generated by the first cable tester, wherein the transmitted test results further comprises the time period associated with the specified test results; and a memory storage device comprising instructions which are configured to cause a computing device to administer a testing scenario wherein the test results are received and stored on the computing device and information regarding the test results is transmitted to a display device in communication with the computing device.

12. The kit of claim 11, further comprising cable components comprising one or more lengths of wiring and multiple connectors for cable ends, the kit further comprising one or more wiring cutting tools, and one or more wiring crimping tools.

13. The kit of claim 11, further comprising a second cable coupler having two receptacle ports, each port configured to receive a different connector than the receptacle ports of the first cable coupler.

14. The kit of claim 11, further comprising a second cable coupler and a second cable tester, wherein the second cable coupler having two receptacle ports, each port configured to receive a connector at an end of a second length of cable and wherein the second cable tester is configured to electrically connect to the second cable coupler and send one or more test signals through the second length of cable and configured to transmit test results based on the one or more test signals associated with the second length of cable to the computing device.

15. The testing system of claim 1, further comprising a toning device, wherein the toning device is configured to communicate with the computing device to send test data that identifies whether a correct correction is achieved between the toning device and the cable coupler, a period of time corresponding to an achieved correct connection, and a number of attempts corresponding to the achieved correct connection.

16. The kit of claim 11, further comprising a toning device, wherein the toning device is configured to communicate with the computing device to send relevant test data that identifies whether a correct correction is achieved between the toning device and the first cable coupler, a period of time corresponding to an achieved correct connection, and a number of attempts corresponding to the achieved correct connection.

\* \* \* \* \*